(12) United States Patent
    Dibb

(10) Patent No.: US 10,209,281 B2
(45) Date of Patent: Feb. 19, 2019

(54) MONITORING POWER STATUS

(71) Applicant: Google LLC, Mountain View, CA (US)

(72) Inventor: Matt Dibb, London (GB)

(73) Assignee: Google LLC, Mountain View, CA (US)

( * ) Notice: Subject to any disclaimer, the term of this patent is extended or adjusted under 35 U.S.C. 154(b) by 120 days.

(21) Appl. No.: 14/961,333

(22) Filed: Dec. 7, 2015

(65) Prior Publication Data
    US 2017/0160319 A1    Jun. 8, 2017

(51) Int. Cl.
    G01R 21/133    (2006.01)
    G01R 19/15     (2006.01)
    H04Q 9/00      (2006.01)

(52) U.S. Cl.
    CPC ........... *G01R 21/133* (2013.01); *G01R 19/15* (2013.01)

(58) Field of Classification Search
    CPC ......... G01R 21/133; G01R 19/15; H04Q 9/00
    See application file for complete search history.

(56) References Cited

U.S. PATENT DOCUMENTS

| 8,594,965 B1 *   | 11/2013 | Elberbaum ........... G06F 19/00 702/107 |
| 2011/0032070 A1* | 2/2011  | Bleile ............... H05B 37/0272 340/3.51 |
| 2014/0300489 A1* | 10/2014 | Rice ................. H04Q 9/00 340/870.02 |
| 2015/0032282 A1  | 1/2015  | Arya et al. |
| 2015/0066227 A1* | 3/2015  | Chapel .................... G05F 1/66 700/295 |
| 2015/0201645 A1* | 7/2015  | Cocchi ................... A23G 9/22 426/231 |
| 2015/0253364 A1  | 9/2015  | Hieda et al. |

(Continued)

FOREIGN PATENT DOCUMENTS

| CN | 204256767  | 4/2015 |
| JP | 2012-181649 | 9/2012 |
| WO | 2014/173783 | 10/2014 |

OTHER PUBLICATIONS

International Search Report and Written Opinion in International Application No. PCT/US2016/063133, dated Mar. 2 2017, 11 pages.

(Continued)

*Primary Examiner* — Neel Shah
(74) *Attorney, Agent, or Firm* — Fish & Richardson P.C.

(57) ABSTRACT

Methods, systems, and apparatus, including computer programs encoded on storage devices, for detecting the power status of an electrical device. In one aspect, an apparatus includes a device that comprises a radio transmitter and a sensor configured to detect the power status of the device. The power status may include information that is indicative of whether the device is powered on or off. The apparatus may also include a processor and a data storage device storing a device identifier associated with the device, and instructions that are operable, when executed by a processor, to cause the processor to perform operations. The operations may include receiving data indicating the power status of the device detected by the sensor, receiving a request for the power status of the device, and transmitting, using the radio transmitter, the device identifier associated with the device and the power status associated with the device.

17 Claims, 6 Drawing Sheets

(56) References Cited

U.S. PATENT DOCUMENTS

2016/0105735 A1* 4/2016 Louzir .................... H04Q 9/00
340/870.02
2016/0195864 A1* 7/2016 Kim ....................... G05B 15/02
709/221

OTHER PUBLICATIONS

MeterPlug, "MeterPlug.Lower your ElectricBill.Measure real Electric Cost," retrieved on Aug. 24, 2015, retrieved from the Internet: URL<https://www.indiegogo.com/projects/meterplug-lower-your-electricbill-measure-real-electric-cost#/>, 20 pages.

Oort—Internet of Everything, "OORT—control your whole living environment with a single app," retrieved on Aug. 24, 2015, retrieved from the Internet: URL<https://www.kickstarter.com/projects/698718196/oort-internet-of-everything>, 32 pages.

Woollaston, "Smart Power Strip—Control your appliances from anywhere," Daily Mail, Dec. 3, 2013 [retrieved on Dec. 7, 2015], retrieved from the Internet: URL<http://www.dailymail.co.uk/sciencetech/article-2517394/App-sends-alert-cooker-left-switched--lets-turn-remotely.html>, 12 pages.

* cited by examiner

MONITORING POWER STATUS

BACKGROUND

Homes may typically contain many different types of electrical devices, many of which may play an important role in facilitating many different aspects of a typical person's daily life. These electrical devices may include appliances such as, for example, clothes irons, hair curling irons, hair straightening tongs, electric space heaters, refrigerators, televisions, or the like. Such electrical devices may typically require a connection to an electrical outlet in order to function for their intended purpose. Though each of the aforementioned electrical devices may provide a specific utility that may help to accommodate aspects of a person's daily life, misuse of such electrical devices may have significant ramifications—some of which could be hazardous to a person, or the person's property.

SUMMARY

According to at least one aspect of the subject matter disclosed by this specification, a method, system, and apparatus, including computer programs encoded on storage devices, are disclosed that may automatically detect the power status of an electrical device. In some aspects, the subject matter in this specification may be embodied in a device that includes a radio transmitter and a sensor configured to detect the power status of the device. The power status may include information that is indicative of whether the device is powered on or off. The device may also include one or more processors, and one or more data storage devices storing (i) a device identifier associated with the device, and (ii) instructions that are operable, when executed by the one or more processors, to cause the one or more processors to perform operations. The operations may include receiving data indicating the power status of the device detected by the sensor, receiving a request for the power status of the device, and transmitting, using the radio transmitter, the device identifier associated with the device and the power status associated with the device. In some implementations, the device identifier and the power status may be transmitted in a single message.

Other versions of the corresponding of subject matter disclosed by this specification may include an electrical plug for a device that includes a plug housing, electrical contacts attached to the plug housing, and a power status reporting device within the plug housing. The power status reporting device may include a radio transmitter and a sensor configured to detect the power status of the device. The power status may include information that is indicative of whether the device is powered on or off. The power status reporting device may also include one or more processors, and one or more data storage devices storing (i) a device identifier associated with the device, and (ii) instructions that are operable, when executed by the one or more processors, to cause the one or more processors to perform operations. The operations may include receiving data indicating the power status of the device detected by the sensor, broadcasting, using the radio transmitter, an advertisement message indicating the presence of the power status reporting device, after broadcasting the advertisement message, receiving a request for information from the power status reporting device, and transmitting, using the radio transmitter and in response to the request, a power status message that includes the device identifier associated with the device and the power status associated with the device.

These and other versions each may optionally include one or more of the following features. For instance, the sensor may be configured to detect whether current is flowing to the device. The sensor may also be configured to determine the power status of the device based on whether current is flowing to the device. The sensor may be configured to detect whether current is flowing into the device by detecting the existence of a magnetic field.

In some aspects, the device may include an electrical plug, wherein the radio transmitter, the sensor, the one or more data storage devices, and the processor are each housed within the electrical plug. Alternatively, or in addition, the device may include a battery that is housed in the plug. In such instances, the device may include recharging circuitry in the plug that is configured to recharge the battery using inductive coupling with a conductor carrying alternating current through the plug.

In other implementations, the device may include a data storage device that stores information associated with the device identifier that indicates a particular device classification type, wherein the particular device classification type indicates whether the device is a device that (1) should be left powered on, or (2) should be left powered off. In some implementations, the storage device may include instructions that, when executed, perform operations that include transmitting the particular class using the radio transmitter.

In yet other implementations, the storage device may include instructions that, when executed, perform operations that include calculating an average amount of power used by the device over a period of time, and transmitting the calculated average amount of power using the beacon.

Aspects of the specification described herein may be integrated within portions of a device that include a hair dryer, a clothes iron, a curling iron, or a refrigerator, among other devices.

BRIEF DESCRIPTION OF THE DRAWINGS

FIG. 1 is a contextual diagram showing features of a system for detecting whether devices are powered on.

DETAILED DESCRIPTION

Figure 1:
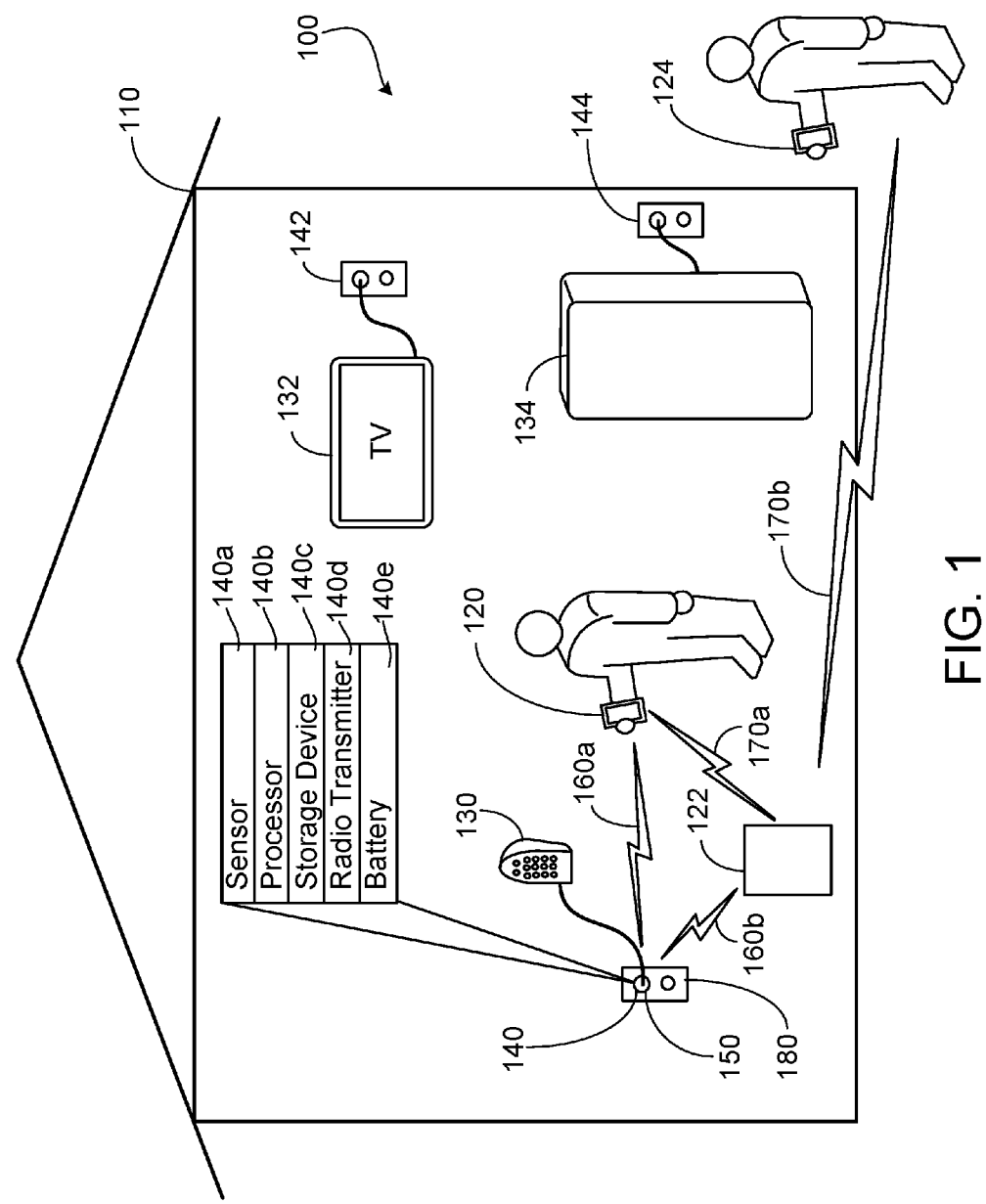

According to at least one aspect of the subject matter disclosed by this specification, a method, system, and apparatus, including computer programs encoded on storage devices, are disclosed that may automatically detect powered on electrical devices. The detection of powered on electrical devices may help to reduce risks due to the misuse of such electrical appliances. Misuse of an electrical device may include, for example, leaving an electrical device plugged into an electrical outlet and powered-on for an excessive amount of time while the electrical device is no longer in use. For some devices, such as clothes irons and other devices with heating elements, accidentally leaving the device powered on could cause a fire or other damage. Risk of loss due to the misuse of an electrical device may be reduced by, for example, transmitting a power status alert to a user associated with the electrical device, based on power status information received from a radio transmitter associated with an electrical device.

In some implementations, components integrated into an electrical device are configured to detect and transmit the power status of the electrical device. The integrated components may include, for example, a sensor and a radio transmitter. The sensor may detect the power status of an electrical device by determining whether the electrical device is powered on or powered off. For example, the sensor may detect whether the electrical device is powered on based on determining whether current is flowing to the electrical appliance. The radio transmitter may transmit information associated with the electrical device, such as a detected power status and a device identifier. The device identifier may be, for example, characters that uniquely identify the electrical device.

A central role device may receive information from radio transmitter, and generate an alert, as necessary, to inform a user of the power status of electrical devices. For example, a mobile phone or other device may receive Bluetooth beacons from appliances, determine that a potentially dangerous appliance is currently powered on, and alert the user. Based on the alerts, the user may identify one or multiple electrical devices that need to be powered on or powered off and change the power status associated with the electrical device(s).

In some implementations, a beacon can alert a central role device that its associated electrical device is powered off. For example, a refrigerator is usually intended to remain powered on so it can preserve the food inside, so it may be valuable for a person to be notified in the event that a refrigerator has been powered off.

In situations in which the systems discussed here collect personal information about users, or may make use of personal information, a user may be provided with controls allowing the user to make an election as to both if and when systems, programs or features described herein may enable collection of user information (e.g., information about a user's social network, social actions or activities, profession, a user's preferences, or a user's current location), and if the user is sent content or communications from a server. In addition, certain data may be treated in one or more ways before it is stored or used, so that personally identifiable information is removed. For example, a user's identity may be treated so that no personally identifiable information can be determined for the user, or a user's geographic location may be generalized where location information is obtained (such as to a city, ZIP code, or state level), so that a particular location of a user cannot be determined. Thus, the user may have control over what information is collected about the user, how that information is used, and what information is provided to the user.

FIG. 1 is a contextual diagram showing features of a system 100 for detecting whether devices are powered on. The example of FIG. 1 shows the system 100 in the context of a home 110. System 100 may include one or multiple central role devices 120, 122, a remote device 124, one or multiple electrical devices 130, 132, 134, and one or multiple status monitoring devices 140, 142, 144. In some implementations, the status monitoring devices 140, 142, 144 send information via Bluetooth messages or beacons and act as peripheral devices with respect to a central role devices 120, 122. A status monitoring device may be integrated into any portion of the corresponding electrical device. In some implementations, a status monitoring device 140 may be integrated into the electrical plug 150 of an electrical device 130.

Each status monitoring device 140, 142, 144 may directly communicate with one or multiple central role devices 120, 122 via one or multiple communication links 160a, 160b. Communication links 160a, 160b may include, for example, one or multiple wireless short-range radio interfaces. For example, each status monitoring device 140, 142, 144 may include a Bluetooth transceiver that exchanges messages with a phone, network router, or other central role device. Communication may occur in one or multiple frequency bands.

Alternatively, or in addition, each status monitoring device 140, 142, 144 may indirectly communicate with at least one remote device 124 via a communication link 170a, 170b, 170c. Communication links 170a, 170b, 170c may include, for example, one or more wired or wireless networks including, for example, a LAN, WAN, 3G network, 4G network, the Internet, mesh network or the like. For instance, a status monitoring device 140, 142, 144 may communicate with a first central role device, such as wireless network router 122, via communication link 160b, and then the wireless network router 122 may relay the communication(s) received from each respective status monitoring device 140, 142, 144 to a remote device such as, for example, remote device 124. Relaying communications from one or multiple status monitoring devices 140, 142, 144 in the manner described above may be particularly beneficial when a user of a central role device 120 has traveled away from home 110 and is outside the range of communication link 160a, 160b. Alternatively, or in addition, wireless network router 122 may relay communications received from one or multiple status monitoring devices 140, 142, 144 to one or multiple cloud based services 190. Cloud-based services may be configured to receive device information from one or more status monitoring devices 140, 142, 144, analyze the received device information, and provide alerts to one or central role devices based on the analysis.

Central role devices 120, 122 may include any device that is configured to directly receive communications transmitted by one or multiple status monitoring devices 140, 142, 144. For example, a central role device may include a desktop computer, laptop computer, wired or wireless network router, tablet computer, smartphone, smartwatch, one or multiple computers that drive a heads-up display associated with smart-glasses/smart-contact lenses, or the like.

Status monitoring devices 140, 142, 144 may include any device that has access to data needed by a central role device 120, 122. Status monitoring devices 140, 142, 144 may be configured to directly, or indirectly, communicate such data to one or multiple central role devices 120, 122. Note that in certain instances, a particular electrical device may be both a central role device and a status monitoring device. For instance, a television 132 may be associated with a status monitoring device 142 that obtains and transmits the power status of television 132. Alternatively, or in addition, a television may be associated with a central role application that receives data transmitted from one or multiple status monitoring devices 140, 142, 144. The television's central role application may process such received data in order to generate one or multiple alerts to a user that are based on the power status of one or multiple electrical devices 130, 132, 134.

A status monitoring device 140 may include a sensor 140a, one or multiple processors 140b, one or more data storage devices 140c, a radio transmitter 140d, and a battery 140e. Sensor 140a may be configured to determine the power status of electrical device 130. For instance, sensor 140a may determine whether electrical device 130 is powered on or powered off. Sensor 140a may determine whether an electrical device 130 is powered on or powered off by detecting whether or not an electrical current is flowing from the electrical outlet 180 to electrical device 130. For example, sensor 140a may include an inductive sensor that has a coil to detect the presence of a magnetic field when current is flowing through a wire. Thus, the inductive sensor may determine that the device is powered on when a magnetic field is detected and current is induced in the coil. Alternatively, the inductive sensor may determine that the device is powered off when a magnetic field is not detected, and thus current is not induced in the coil. The output of sensor 140a may be analog or digital. Circuitry of the sensor may generate a binary output that indicates whether the electrical device is powered on based on whether induced current in the sensor coil is above a threshold. Alternatively, or in addition, the output of sensor 140a may indicate, based on the induced current in the sensor, an amount of current flowing to the electrical device. This amount of current can be provided as an analog or digital value that is representative of, for example, a current value in Amps or milli-Amps. One or multiple processors 140b may execute instructions that may obtain, or otherwise receive, output readings from sensor 140 at predetermined intervals of time. For example, processor(s) 140b may obtain an output reading from sensor 140a every second, every 5 seconds, every 10 seconds, or the like.

Storage device 140c may include one or multiple storage devices. Storage device 140c may be configured to store information associated with electrical device 130. Information associated with electrical device 130 may include, for example, power-status outputs, a device identifier, a human-understandable device name, a device classification type, the time the electrical device last used power, or the like. The power-status outputs may include one or multiple outputs from sensor 140a. For instance, storage device 140 may store the most recent power-status output of sensor 140a and/or varying levels of historical power-status outputs such as, for example, power status outputs for the last week, last month, or even every power status output of sensor 140a. Stored power-status information may be used to calculate, for example, the average power used by an electrical device over a predetermined period of time, e.g., the last hour, the last day, and so on.

The device identifier may include any unique string of one or multiple characters that may be capable of uniquely identifying a particular electrical device. For instance, the device identifier may be a 128-bit universally unique identifier (UUID). Such a device identifier may be assigned to the electrical device 130 by the manufacturer and stored in the storage device 140c prior to purchase of the electrical device 130. Alternatively, a device identifier may be assigned and stored later. The human-understandable device name may include text that indicates the device type, brand, or model name, for example, "Clothes Iron", "Clothes Iron, model 1015", or the like. Because the device identifier, name, other data can be already stored when the electrical device 130 is purchased by a user, the monitoring device 140 can broadcast its identity without the need for any set up or input from the user.

The device classification type may provide an indication of the nature of the device such as, for example, to indicate whether the electrical device should remain powered on when not in use, or whether the electrical device should remain plugged into an electrical outlet 180 when not in use. For example, a clothes iron may be associated with a device classification type or tag that indicates that the clothes iron should not remain powered on when not in use. For devices associated with such a device type or tag, a central role device may provide an alert to a user if it is determined that the device has been powered on longer than a predetermined amount of time, or when an event occurs, such as detecting that the user has left the house 110. Similarly, a device classification may indicate whether the electrical device 130 should be left plugged into the electrical outlet 180 when not in use. Using the classification and sensor data indicating whether the electrical device 130 is plugged in, a central role device may alert a user if an electrical device that should not remain plugged in has been plugged in for more than a threshold amount of time or when certain conditions are detected. Some devices are intended to remain powered on or plugged in for an extended period of time. For example, the classification type or tag for a device such as a refrigerator may indicate that the refrigerator should be left plugged into an electrical outlet 180 at all times. For devices associated with such a device type or tag, a central role device may provide an alert to a user if, for example, it is determined that the electrical device 130 is not connected to power, is currently powered on, or has not powered on for at least a predetermined amount of time.

Other types of device classification types or tags may be stored. For example, data indicative of the time the electrical device last used power may be stored. Such data may include, for example, a timestamp that is indicative of the last time that sensor 140a last detected that the electrical device was powered on, the time sensor 140a last detected that current flowing to the electrical device, or the like.

Radio transmitter 140d may be configured to transmit any of the one or multiple types of device information that are maintained in storage device 140c. For instance, radio transmitter 140d may transmit power-status outputs, a device identifier, a human-understandable device name, a device classification type, average power usage, or the like. The device information may be transmitted together in a single message or spread across multiple messages. Radio transmitter 140d may be configured to repeatedly advertise the presence of the status monitoring device 140, which may suggest that power status information is available for the electrical device 130. For instance, radio transmitter 140d may be configured to periodically broadcast such advertisements multiple times per second, every second, once every 3 seconds, once every 5 seconds, or the like. A central role device 120, 122, after detecting the advertisement, may request information that relates to a particular electrical device 130, 132, 134. In at least one aspect of the present disclosure, the radio transmitter 140d may include a small Bluetooth Low Energy wireless beacon. Alternatively, however, other low-powered RF devices may be utilized to implement the functionality of the radio transmitter 140d.

Status monitoring device 140 may also include a battery 140e. Battery 140e may allow status monitoring device 140 to remain powered on at all times. Accordingly, when utilizing battery 140e for power, status monitoring device 140 may be able to continuously advertise the power status of a particular electrical device, even when the particular electrical device is not plugged into an electrical outlet 180. When a Bluetooth Low Energy beacon or another low-powered RF device is used to implement functionality of the radio transmitter 140d, the status monitoring device 140 may be able to remain powered for extended periods of time on a single watch battery. Alternatively, or in addition, battery 140*e* may be rechargeable. In accordance with certain aspects of the present disclosure, the status monitoring device may include recharging circuitry to recharge the battery 140*e*. Recharging circuitry may recharge the battery 140*e* using current induced in coils that are inductively coupled to the wires that carry power from the electrical outlet 180 to the electrical device 130.

Figure 2:
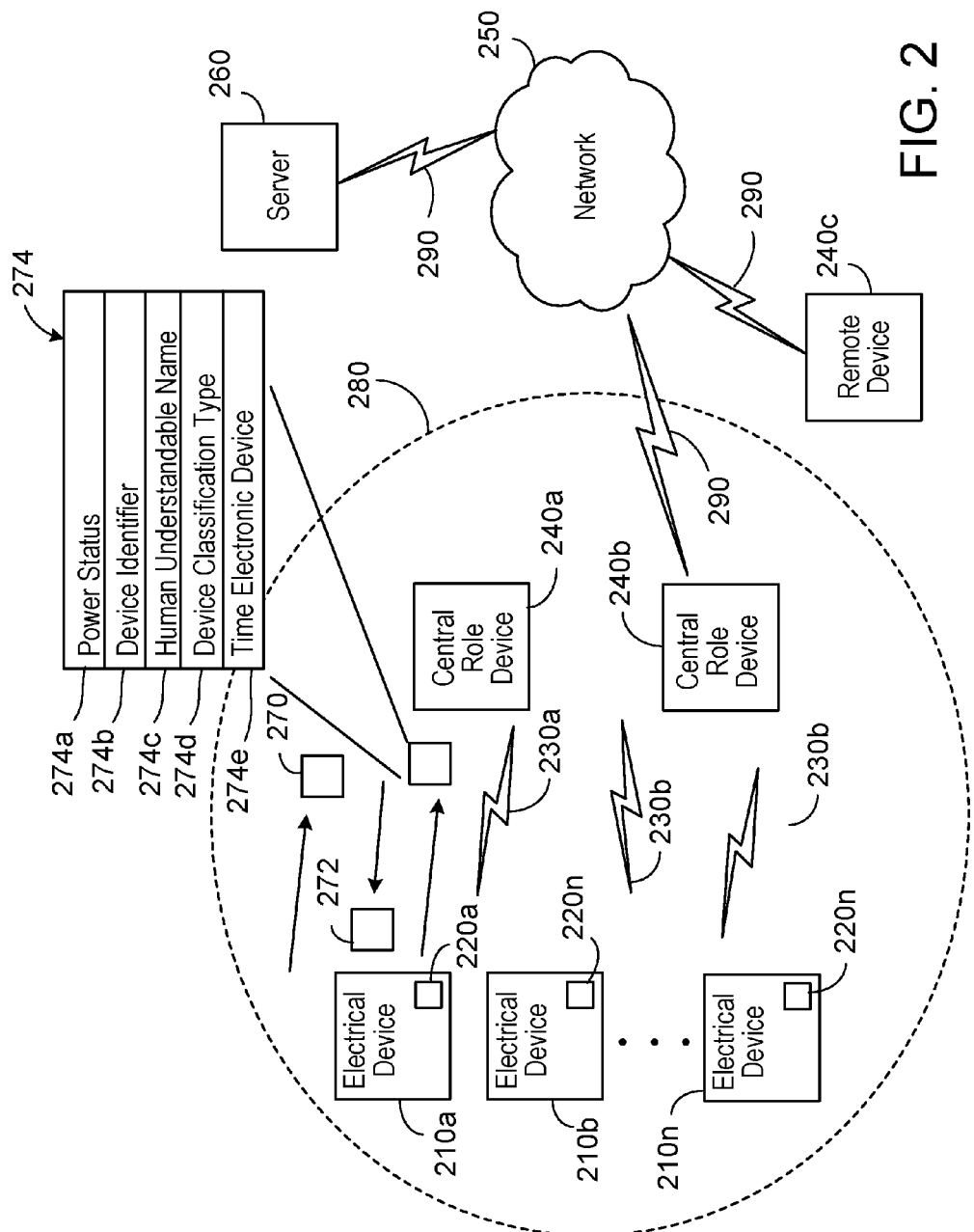
FIG. 2 is a block diagram showing an example of a system that may facilitate detection of powered-on electrical appliances.

FIG. 2 is an example of a system 200 that may facilitate automatic detection of powered-on electrical appliances. System 200 may include one or multiple electrical devices 210*a*, 210*b*, . . . 210*n*, one or multiple status monitoring devices 220*a*, 220*b*, 220*n*, short range communication links 230*a*, 230*b*, . . . 230*n*, one or multiple central role devices 240*a*, 240*b*, a remote device 240*c*, a network 250, and server 260. Network 250 may include one or multiple networks such as, for example, a LAN, WAN, 3G network, 4G network, the Internet, mesh network or the like.

Each electrical device 210*a*, 210*b*, . . . 210*n* may include at least one corresponding status monitoring device 220*a*, 220*b*, . . . 220*n*, as depicted in FIG. 2. Status monitoring devices 210*a*, 210*b*, 210*n* may have the features of status monitoring devices 140, 142, 144 that were described with reference to FIG. 1.

Each status monitoring device 210*a*, 210*b*, . . . 210*n* may be configured to advertise its presence to a central role device. In some implementations, a status monitoring device indicates that it possesses device information that is associated with its corresponding electrical device 210*a*, 210*b*, . . . 210*n* using an advertisement 270. Status monitoring devices 220*a*, 220*b*, . . . 220*n* may be configured to periodically transmit advertisements such as, for example, advertisement 270, using a radio transmitter, regardless of whether a particular central role device is reading or requesting device information associated with an electrical device that corresponds to a particular advertisement 270. An advertisement 270 may be a basic message that may include just enough detail to indicate to a central role device 240*a*, 250*b* that the status monitoring device includes additional information related to a particular device. For instance, an advertisement may simply include a tag that classifies the message as an advertisement, and a device identifier. Due to the small size of the advertisement 270, a very small amount of power is needed for transmission, allowing a status monitoring device to transmit advertisements consistently for extended periods while on battery power. However, it should be contemplated that other types of device information may be included within advertisement 270, as necessary.

A central role device 240*a*, 240*b* may be configured to receive an advertisement 270 and request additional information from the status monitoring device identified by the advertisement 270. For example, the central role device 240*a*, 240*b* may send a response message 272, via Bluetooth or another short-range RF communication interface, to one or more status monitoring devices. For instance, the response message 272 may be transmitted from the central role device 240*a*, 240*b* to the status monitoring device 220*a*, in order to request the power status associated with electrical device 210*a*. In response to the response message 272, status monitoring device 220*a* may transmit a power status message 274 to the requesting central role device that includes the power status of electrical device 210*a*. Alternatively, or in addition, power status message 274 may include all, or a subset, of the information maintained in a status monitoring storage device's data storage device 140*c*.

The request message 272 may be transmitted by a central role device 240*a*, 240*b* periodically based on a predetermined amount of time, based on one or multiple predetermined activity triggers, or the like. For example, the mobile application may periodically request additional information associated with one or multiple advertisements 270 based on the expiration of a predetermined amount of time such as, for example, every 10 seconds, every minute, every 5 minutes, or the like. Alternatively, or in addition, the mobile application may be configured to selectively request 272 additional information about an advertisement 270 in accordance with a predetermined activity trigger. For example, a mobile application may be configured to request additional information associated with a status monitoring device after a person opens, or manually refreshes, a mobile application for viewing power status information. The mobile application may be executed on a central role device, for example, if the central role device is the user's smartphone. As another example, the mobile application may be executed on another device, for example, when a router in the user's home acts the central role device and the user uses the mobile application on his phone remotely.

A status monitoring device such as, for example, status monitoring devices 210*a*, 210*b*, . . . 210*n*, may directly communicate advertisements 270 and/or power status messages 274 to one or multiple central role devices such as, for example, central role devices 240*a*, 240*b* using short range communication links 230*a*, 230*b*. In some implementations, multiple devices coordinate reception and processing of power status information. For example, different central role devices 240*a*, 240*b* may be located in different areas and may thus communicate with different sets of devices. The central role devices 240*a*, 240*b* may also provide information to other devices, such as a server 260 or a remote device 240*c*, so that power status information is available remotely.

The power status message 274 provided in response to a central role device's 240*a*, 240*b* request 272 may include one or multiple different types of device information that each status monitoring device stores in a corresponding data storage device such as, for example, storage device 140*c*. For instance, power status message 274 may include a power status 274*a*, a device identifier 274*b*, a human understandable name 274*c*, a device classification type 274*d*, a time the electrical device last drew power 274*e*, or the like. In certain instances, power status message 274 may not include a human understandable name 274*c* or a device classification type 274*d*. In such instances, mobile application may map a device identifier 274*b*, or other device attribute, to a human understandable name and/or device classification type maintained using information locally available to the central role device 240*a*, 240*b*. Alternatively, or in addition, power status message 274 may also include information that may be indicative of the power consumption of a particular electrical device. For example, power status message 274 may include the current rate of power consumption of an electrical device, past power consumption of an electrical device for a particular period of time, or the like. Alternatively, or in addition, power status message 274 may also include any GATT characteristic that may be informative regarding any characteristic of a particular electrical device 210*a*, 210*b*, . . . 210*n*.

While a user is at home, the user's phone or other device may receive and process power status messages 274 as a central role device. In some instances, a user will desire to obtain power status information for his electrical devices from a remote location, for example, while the user is away from home. When a remote device 240*c*, such as a user's phone, resides outside the maximum range 280 of short range communication links 230a, 230b, the remote device 240c may receive power status information indirectly through one or more other devices. For instance, status monitoring device 220a may transmit a power status message 274 to router 240b, and then information in the power status message 274 may be relayed by router 240b to a remote device 240c through network 250, e.g., via one or more wired or wireless communication links 290.

In some implementations, a central role device 240a, 240b provides power status information to a server 260 via network 250. Server 260 may provide a cloud-based service that analyzes received power status information, and may then provide alerts to help minimize the risk of loss due to misuse of electrical devices. For example, the server 260 may analyze received power status information to determine whether each monitored device has an appropriate power status. From the data in a power status message 274, the server 260 may evaluate the device classification to determine whether a particular electrical device should remain powered on, and may evaluate the power status to determine whether the current status matches what is indicated by the device classification. If the current status is different from what the device classification indicates, the server 260 can send a message to the remote device 240c alerting the user which electrical device has an inappropriate power status. In some implementations, a central role device or a remote user device analyzes the power status information and determines whether to alert a user, in addition to or instead of analysis by the server 260.

In some implementations, the server 260 may determine an urgency of an alert to a user based on a device classification, device type, or other device information. For example, although a television generally does not remain powered on for extended periods, there is little harm in the television remaining on, and the server 260 may determine that an alert is not needed. The user may view the status with a mobile application, but may not need to be notified immediately. On the other hand, if the server 260 determines that a device that is powered on is one with a heating element, such as a cooktop, a clothes iron, a curling iron, etc., or is a device classified as potentially dangerous, the server 260 can send an alert and may indicate that urgent attention is needed.

In some implementations, a central role device 240a, 240b or server 260 may provide alerts to a user device, such as a smartphone, remote device 240c, or other device. The server 260 may be configured to receive and monitor device information in real-time, as received from a central role device 240a, 240b. The server 260 then provides information, including alerts, regarding the power status of one or more electrical devices. Based on an analysis of the received device information, server 260 may be configured to transmit an alert to a user device to notify a person when an electrical device, such as a clothes iron, has been powered on in excess of a predetermined amount of time. Similarly, server 260 may transmit an alert to a user device to notify a person in certain instances wherein an electrical device such as, for example, a refrigerator has been powered off in excess of a predetermined amount of time.

In some implementations, alerts may be location-based. For instance, server 260 may be configured to transmit alerts to a user device based on a determination that the user device has left a person's home, hotel, office, or other building. As an example, the server 260 may determine when the user device of a particular user has left the monitored area, e.g., the user's home, where the electrical devices are located. When the server 260 determines that the user has left the monitored area, the server 260 may assess the most recent power status information. For example, the server 260 may request updated power status information from the central role device 240a, 240b. If analysis of the power status information indicates one or more multiple electrical devices in the person's home, hotel, office, or other building have a problematic power status, the server 260 sends an alert to the user device giving the person the opportunity to correct the power status associated one or multiple electrical devices before traveling very far from the electrical device that needs attention. The alerts may contain all, or a subset, of the information maintained by a status monitoring device regarding a particular electrical device.

The location of the user device may be determined in any of various ways. For example, the central role device 240a, 240b and the user device may communicate, e.g., via Bluetooth, Wi-Fi, or other short-range wireless communication, when they are in proximity. When the connection is broken, or when the devices do not communicate for a threshold period of time, the central role device 240a, 240b, the user device, or both may notify the server 260 to indicate that the devices are likely no longer in proximity. Thus, the server 260 may transmit an alert based on a determination that the user device has moved beyond the maximum range of short-range communication links 230a, 230b, 230c. As another example, the user device may include a GPS receiver and may send a notification to the server 260 when the user device leaves an area, such as the user's home. Finally, the user device may determine that it has left the monitored area when it no longer receives advertisements from the electrical devices in the monitored area, and the user device may inform the server that it has left the monitored area.

Figure 3:
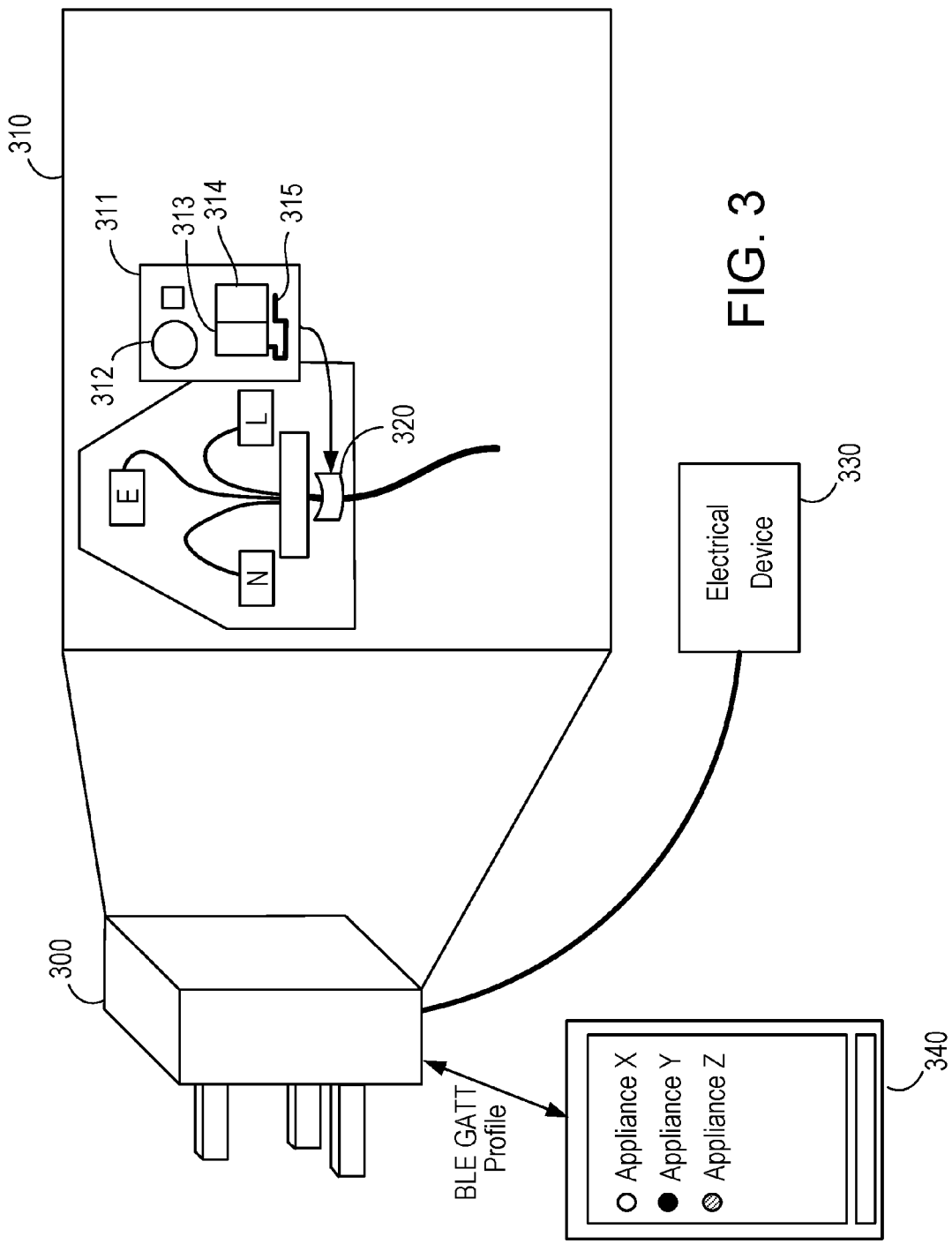
FIG. 3 is an example of a status monitoring device that has been integrated into a plug of an electrical device.

FIG. 3 is an example of a status monitoring device 310 that has been integrated into a plug 300 of an electrical device. Status monitoring device 310 may include, for example, a circuit board 311, a battery 312, a processor 313, a storage device 314, a radio transmitter 315, and a current sensor 320.

In the example of FIG. 3, the status monitoring device 310 is integrated into a plug 300 of an electrical device. The status monitoring device 310 may include a circuit board 311 that may provide interconnections between one or multiple of the other components of the status monitoring device 310. Battery 312 may provide power to the status monitoring device. Battery 312 may allow status monitoring device 310 to function, for example, when plug 300 is not coupled to an electrical outlet. In some implementations, circuit board 311 may also include recharging circuitry to recharge battery 312. A processor 313 and storage device 314 may be mounted on the circuit board 311. Processor 313 may execute instructions that facilitate operation of the status monitoring device. For instance, processor 313 may execute instructions that perform operations such as capturing an output reading of current sensor 320, storing power status readings obtain by current sensor 320 in storage device 314, and transmitting advertisements, power status readings, and/or other device information stored in storage device 314 using radio transmitter 315. In at least one aspect of the present disclosure, radio transmitter 315 may be a Bluetooth Low Energy beacon. Plug 300 may also include a relay that may be responsive to an instruction from a mobile application associated with a central role device. For instance, in response to an instruction from a mobile application associated with a central role device, the relay may break the circuit established when plug 300 is inserted into an electrical outlet in order to cut off the supply of current to the electrical device, forcing the electrical device to power down.

Current sensor 320 may include an inductive sensor that comprises a coil. Current sensor 320 may be configured such that the wire 330 that provides current to the electrical device may pass through the coil. The current sensor 320 may detect a power status associated with the device based on the presence of a magnetic field caused by the flow of AC power to the attached electrical device. These magnetic fields may induce a current in the current sensor 320 which can be used to determine an amount of current flowing to the attached electrical device. For instance, a magnetic field may be detected by current sensor 320 when current is flowing through the wire 330. Accordingly, in such instances, current sensor 320 may determine that the electrical device is powered on. Alternatively, when no current is flowing through the wire 330, no magnetic field may be detected by current sensor 320. Accordingly, in such instances, current sensor 320 may determine that the electrical device is powered off.

Status monitoring device 310 may also be configured to determine the amount of power consumed by an electrical device 330. The power consumed by an electrical device may be determined over a predetermined period of time as a function of the input voltage and current detected by current sensor 320 associated with an electrical device 330. Status monitoring device 310 may be configured to store a power consumption determination, or each power consumption determination, in storage device 314. Status monitoring device 310 may analyze power consumption reads maintained in storage device 314 in order to determine the amount of power used by an electrical device 330, time periods when electrical device 330 is powered on/powered off, or the like.

Status monitoring device 310 may be configured to communicate with a device 340 in the manner described with respect to FIG. 2. Accordingly, any of the data maintained by storage device 314 may be provided to device 340 for display via application 342 in order to inform a user of device 314 regarding the power status one or multiple electrical appliances.

Figure 4:
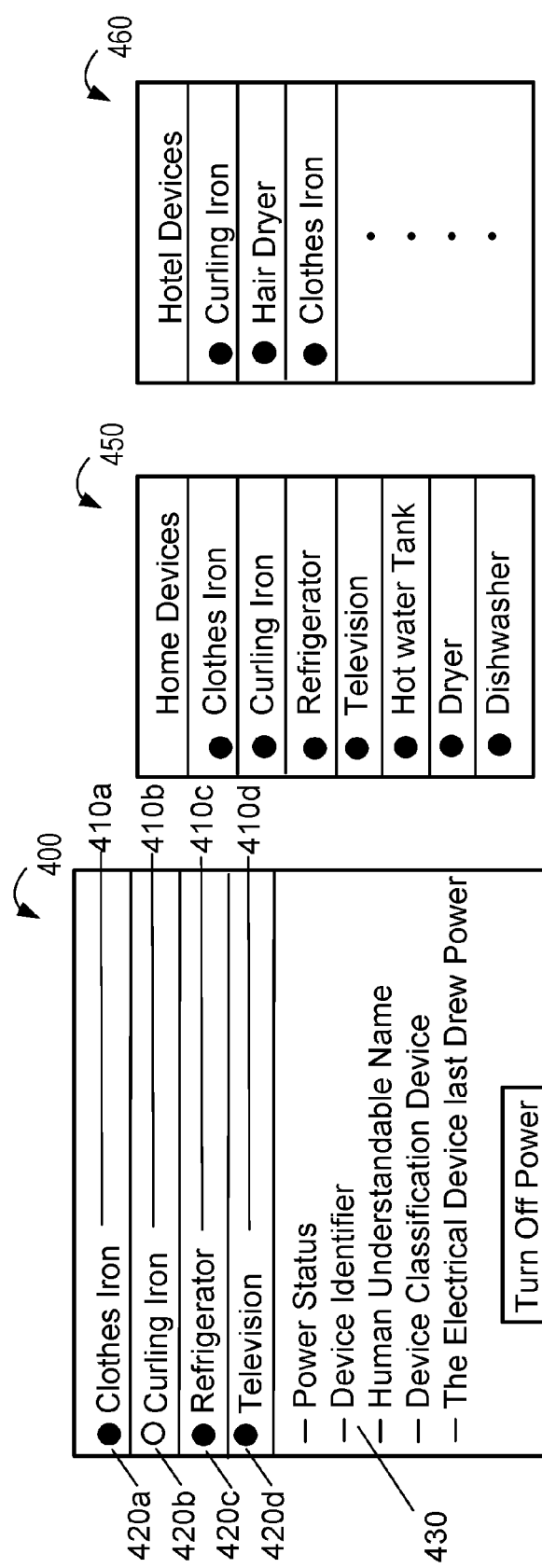
FIG. 4A-4C are examples of user interfaces that may be provided by a mobile application of a central role device.

FIG. 4A-4C are examples of user interfaces 400, 410, 420 that may be provided, for example, by a mobile application of a user device, a web page, or other user interface.

In the example of FIG. 4A, the user interface 400 of the mobile application may provide a display that includes each electrical device residing within a user's home. Each electrical device displayed by user interface 400 may be associated with a device name. The device name for each respective electrical device displayed by user interface 400 may include, for example, a human-understandable device name 410a, 410b, 410c, 410d as shown in FIG. 4A. User interface 400 may provide a graphical power status indicator 420a, 420b, 420c, 420d for each electrical device that is displayed that may facilitate a quick and easy determination of whether or not an electrical device is associated with a problematic power status. For instance, a device that is safely powered off, or otherwise associated with a non-problematic power status, may be associated with a graphical indicator of a first color as shown with respect to power status indicator 420a. For example, a graphical indicator associated with a non-problematic power status may include, for example a "green dot" next to the device name. Alternatively, for example, a device that is associated with a powered-on status when a device is not in use, or some other problematic power status, may be associated with a graphical indicator that is a different color than the first color as shown with respect to 420b. For example, a graphical indicator associated with a problematic power status may include, for example, a "red dot" next to the device name. The graphical power status indicator may be generated by the mobile application based in part, for example, on an analysis of an electrical device's power status and/or the electrical device's device classification type. Alternatively, or in addition, the graphical power status indicator may be generated based on an instruction received from the server 260 after the server 260 analyzes an electrical device's power status and/or the electrical device's classification type. Though the example graphical power status indicators are set forth herein as a "green dot" and a "red dot," it should be appreciated that other types of graphical power status indicators may be used such as, for example, various icons, font types/sizes, highlighting, emojis, and/or the like. Similarly, it should be appreciated that the graphical power indicators described above may be displayed in any portion of user interface 400 in order to convey the power status of an electrical device to a user.

Each displayed electrical device may be expandable in order to display additional information 430 related to the device. Such additional information 430 may be displayed upon the selection of a particular electrical device displayed by user interface 400. The additional information 430 that is displayed may include any device information that was received in response to a request 272 for additional information associated with an advertisement 270 or in an alert from server 260. The expandable display may also provide a selectable icon 440 that may be selected to power down a powered on electrical device. In response to a selection of the selectable icon, the mobile application may send an instruction to a communication device associated with a relay in plug 300 in order to power down the corresponding electrical device.

The graphical user interface 400 may be configured to facilitate the creation of one or multiple customized groups of various electrical devices currently residing within a person's home, hotel, office, or other building. For example, a person may use a mobile application to create a "Home" group which includes a list of all the electrical devices residing within the person's home, as shown by user interface 450 in FIG. 4B. Alternatively, a person may create an alternative "Hotel" group, as shown by user interface 460 in FIG. 4C. A "Hotel" group may include, for example, a group of all the electrical devices that a person brought with him on a particular trip, which currently reside within the person's hotel room.

Mobile application may provide for a variety of other user interactive features. For example, mobile application may be configured to receive human-understandable name that may be associated with a particular electrical device. Alternatively, or in addition, mobile application may provide an interface that facilitates registration of a status monitoring device when a user purchases an electrical device. For example, an electrical device may be associated with a unique identifier at the time of purchase. The unique identifier may be printed on a portion of the electrical device, included with documentation associated with the device, or the like. Then, when a person plugs the electrical device into an electrical outlet 180, a central role device may detect an advertisement transmitted by the status monitoring device associated with the electrical device. Upon the detection of the advertisement, the mobile application may be configured to ask a person whether the device belongs to the person. A person may then enter the unique identifier that was previously obtained in order to demonstrate ownership of the device and establish the electrical device as a device that should be monitored by the person's mobile application. Alternative methods of device registration are also considered to fall within the scope of the present disclosure. For example, a user may be use a web browser to access a cloud based registration service provided by the server 260. The cloud based registration service may ask a user to input a unique identifier for each electrical device that a person owns and require monitoring.

Figure 5:
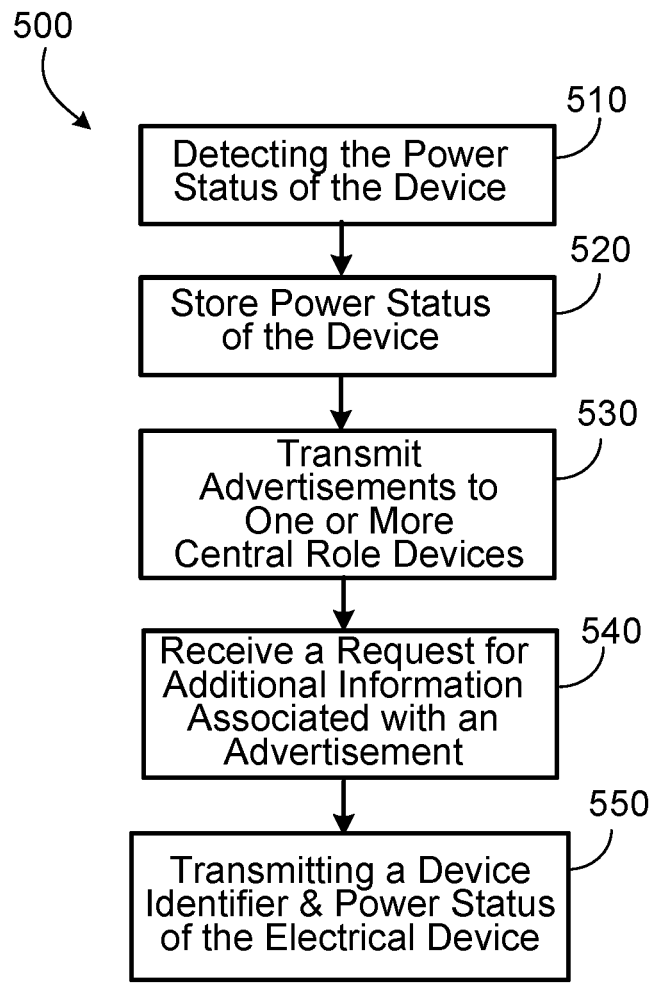
FIG. 5 is a flowchart of a process that may facilitate detection of powered-on electrical appliances.

FIG. 5 is a flowchart of a process 500 that may facilitate automatic detection of powered-on electrical appliances, in accordance with one aspect of the present disclosure.

Process 500 may begin at 510 by detecting the power status of a device. The power status of the device may be detected by using a sensor 140*a*. Sensor 140*a* may be configured to detect whether an electrical device is powered on or powered off. In at least one aspect of the present disclosure, sensor 140*a* may determine whether an electrical device is powered on or off by determining whether current is flowing to an electrical device. For example, the sensor 140*a* may be configured to detect whether current is flowing into the device by detecting the existence of a magnetic field. The power status of an electrical device may be stored at 520 in storage device 140*c*.

Process 500 may continue at 530 by utilizing a radio transmitter 140*d* to transmit advertisements 270, which may be received by one or multiple central role devices 120, 122. The advertisement 270 may include a basic message that includes a limited amount of information necessary to indicate the presence of the status monitoring device 140, 142, 144, and in some implementations, that the status monitoring device possesses power status information corresponding to a particular electrical device. For example, an advertisement 270 may include data indicating that the message is classified as an advertisement, and a device identifier.

Process 500 may continue at 540 where a status monitoring device 140, 142, 144 may receive a request 272 for additional information associated with a particular advertisement. The request for additional information associated with a particular advertisement may originate from a central role device 120, 122. In some implementations, a user of a remote user device 240*c* may initiate a request for information, which is provided to a server 260 and relayed to a central role device that communicates directly to status monitoring devices. In response to receiving a request 272 for additional information, status monitoring device 140, 142, 144 may obtain information associated with an electrical device including, for example, power status information associated with the device. Alternatively, however, status monitoring device 140, 142, 144 may obtain any information associated with an electrical device that may be maintained in storage device 140*c* associated with a status monitoring device.

Process 500 may conclude at 550 by transmitting a power status message to the central role device 120, 122 that requested additional information associated with a particular advertisement 270. The transmitted power status message may include at least a device identifier and a power status. Alternatively, however, the transmitted power status message may include any information associated with an electrical device that may be maintained in storage device 140*c* associated with a status monitoring device.

Figure 6:
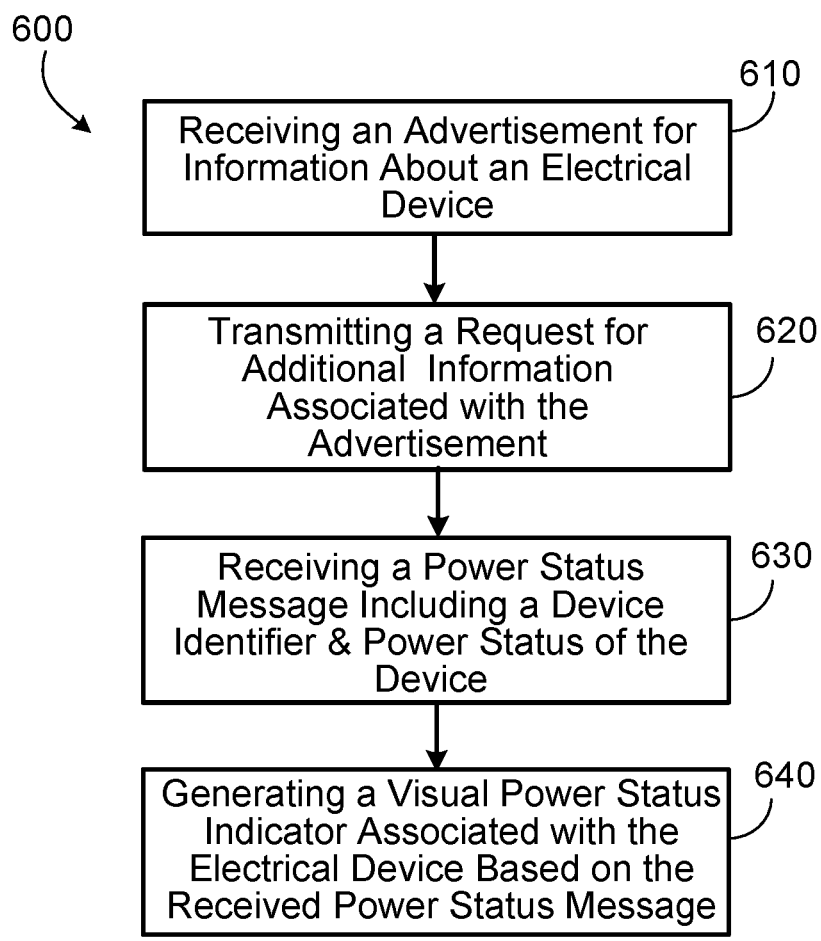
FIG. 6 is flowchart of a process that may be employed by a central role device.

FIG. 6 is flowchart that provides an example of a process 600 that facilitates functionality employed by a central role device. In some implementations, the central role device includes a mobile application that causes a user device, such as a user's phone, to perform the actions of the process 600.

Process 600 may begin at 610 when an advertisement 270 for power status information associated with an electrical device is received by a central role device 120, 122. The advertisement 270 may include a basic message that includes a limited amount of information necessary to indicate to a central role device 120, 122 that the status monitoring device 140, 142, 144 possess power status information corresponding to a particular electrical device. In accordance with at least one aspect of the present disclosure, an advertisement 270 may merely include data indicating that the message is classified as an advertisement, and a device identifier. In response to the receipt of an advertisement 270, mobile application may transmit, at 620, a request 272 for additional information associated with the status monitoring device that submitted the advertisement 270.

Process 600 may continue at 630 when the mobile application may receive a power status message from the status monitoring device 140, 142, 144 that sent advertisement 270. The power status message 274 may include, for example, a device identifier and power status of an electrical device. Alternatively, however, the transmitted power status message may include any information associated with an electrical device that may be maintained in storage device 140*c* associated with a status monitoring device.

Process 600 may conclude at 640 when the mobile application generates a visual power status indicator associated with an electrical device. The generated visual power status indicator may be based on the information received in the power status message. For instance, the power status message may include a device classification type that indicates the corresponding electrical device should not be left powered on when not in use, and a powered on status. Accordingly, the mobile application may generate a "red dot," or other warning indicator, that may be displayed in association with the corresponding electrical device in the graphical user interface associated with the mobile application.

Embodiments of the subject matter, the functional operations and the processes described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible nonvolatile program carrier for execution by, or to control the operation of, data processing apparatus. Alternatively or in addition, the program instructions can be encoded on an artificially generated propagated signal, e.g., a machine-generated electrical, optical, or electromagnetic signal that is generated to encode information for transmission to suitable receiver apparatus for execution by a data processing apparatus. The computer storage medium can be a machine-readable storage device, a machine-readable storage substrate, a random or serial access memory device, or a combination of one or more of them.

The term "data processing apparatus" encompasses all kinds of apparatus, devices, and machines for processing data, including by way of example a programmable processor, a computer, or multiple processors or computers. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, or a combination of one or more of them.

A computer program (which may also be referred to or described as a program, software, a software application, a module, a software module, a script, or code) can be written in any form of programming language, including compiled or interpreted languages, or declarative or procedural languages, and it can be deployed in any form, including as a standalone program or as a module, component, subroutine, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Computers suitable for the execution of a computer program include, by way of example, can be based on general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few.

Computer readable media suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

While this specification contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous. Other steps may be provided, or steps may be eliminated, from the described processes. Accordingly, other implementations are within the scope of the following claims.

What is claimed is:

1. An appliance comprising:
an electrical plug housing, the electrical plug housing further comprising:
a radio transmitter;
a sensor configured to (i) detect the power status of the appliance, wherein the sensor is configured to detect an existence of an electrical current flowing through at least a portion of the appliance and, (ii) responsive to a detection of an existence of an electrical current flowing through at least a portion of the appliance, generate information that is indicative of whether the appliance is powered on or off;
one or more processors; and
one or more data storage devices storing (i) an appliance identifier associated with the appliance, (ii) information describing a particular appliance classification type, wherein the particular appliance classification type indicates whether the appliance is either an appliance that should be left powered on or is an appliance that should be left powered off, and (iii) instructions that are operable, when executed by the one or more processors, to cause the one or more processors to perform operations comprising:
periodically obtaining, by the one or more processors and from the sensor, the information generated by the sensor that is indicative of whether the appliance is powered on or off;
receiving, using the radio transmitter, a request, that originates from a mobile application of a user device, for the power status of the appliance; and
in response to receiving the request for the power status of the appliance that originates from the mobile application of the user device, transmitting, using the radio transmitter, (i) the appliance identifier associated with the appliance, (ii) the information describing the particular appliance classification type, and (iii) the power status associated with the appliance as indicated by at least a portion of the information that was generated by the sensor and obtained by the one or more processors.

2. The appliance of claim 1,
wherein the sensor is configured to detect the existence of current flowing through at least a portion of the appliance by detecting the existence of a magnetic field.

3. The appliance of claim 1, further comprising a battery that is housed in the electrical plug.

4. The appliance of claim 3, further comprising recharging circuitry in the plug that is configured to recharge the battery using inductive coupling with a conductor carrying alternating current through the plug.

5. The appliance of claim 1, wherein the (i) the appliance identifier associated with the appliance, (ii) the information describing the particular appliance classification type, and (iii) the power status associated with the appliance as indicated by the information that was generated by the sensor and obtained by the one or more processors are transmitted in a single message.

6. The appliance of claim 1, wherein the operations further comprise:
determining an average amount of power used by the appliance over a period of time; and,
transmitting the determined average amount of power using the radio transmitter.

7. The appliance of claim 1, wherein the appliance is a hair dryer, a clothes iron, a curling iron, a television, an electric space heater or a refrigerator.

8. The appliance of claim 1, wherein the transmitted information describing the device classification type, when received and processed by a user device, is configured to cause the user device to generate a graphical power indicator for output on a display of the user device.

9. The device of claim 1, wherein the appliance that should be left powered on includes an appliance that should be left powered on when not in use.

10. The device of claim 1, wherein the appliance that should be left powered off includes an appliance that should be left powered off when not in use.

11. A method comprising:
detecting the power status of an appliance using a sensor, wherein detecting the power status of the appliance includes, determining, by the sensor, whether an electrical current flowing through at least a portion of the appliance has been detected;
responsive to the detection of an electrical current flowing through at least a portion of the appliance, generating, by the sensor, information that is indicative of whether the appliance is powered on or off;
storing, on one or more storage devices, (i) an appliance identifier associated with the appliance, (ii) information describing a particular appliance classification type, wherein the particular appliance classification type indicates whether the appliance is either an appliance that should be left powered on or is an appliance that should be left powered off;
receiving, using a radio transmitter, a request, that originates from a mobile application of a user device, for the power status of the appliance;
in response to receiving the request for the power status of the appliance that originates from the mobile application of the user device, accessing, using one or more processors, the storage device to retrieve (i) the appliance identifier associated with the appliance, (ii) the information describing the particular appliance classification type, and (iii) the power status associated with the appliance as indicated by the information that was generated by the sensor and obtained by the one or more processors; and
transmitting, using the radio transmitter, (i) the appliance identifier associated with the appliance, (ii) the information describing the particular appliance classification type, and (iii) the power status associated with the appliance as indicated by at least a portion of the information that was generated by the sensor and obtained by the one or more processors,
wherein the radio transmitter, the sensor, the one or more storage devices, and the one or more processors are each housed within an electrical plug of the appliance.

12. The method of claim 11, wherein determining whether an electrical current is flowing through the appliance comprises:
determining that the electrical current is flowing through at least a portion of the device appliance comprises detecting an existence of a magnetic field.

13. The method of claim 11, comprising:
recharging a battery using recharging circuitry that is (i) housed in the electrical plug and (ii) configured to charge the battery using inductive coupling with a conductor carrying alternating current through the plug.

14. The method of claim 11, wherein transmitting, using a radio transmitter, (i) the appliance identifier associated with the appliance, (ii) the information describing the particular appliance classification type, and (iii) the power status associated with the appliance comprises:
transmitting, using a radio transmitter, (i) the appliance identifier associated with the appliance, (ii) the information describing the particular appliance classification type, and (iii) the power status associated with the appliance in a single message.

15. The method of claim 11, comprising:
determining an average amount of power used by the appliance over a period of time; and,
transmitting the determined average amount of power using the radio transmitter.

16. The method of claim 11, wherein the appliance is a hair dryer, a clothes iron, a curling iron, a television, an electric space heater or a refrigerator.

17. The method of claim 11, wherein the transmitted information describing the appliance classification type, when received and processed by a user device, is configured to cause the user device to generate a graphical power indicator for output on a display of the user device.

* * * * *

UNITED STATES PATENT AND TRADEMARK OFFICE
CERTIFICATE OF CORRECTION

| | | |
|---|---|---|
| PATENT NO. | : 10,209,281 B2 | Page 1 of 1 |
| APPLICATION NO. | : 14/961333 | |
| DATED | : February 19, 2019 | |
| INVENTOR(S) | : Dibb | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 217 days.

Signed and Sealed this
Thirteenth Day of December, 2022

*Katherine Kelly Vidal*

Katherine Kelly Vidal
*Director of the United States Patent and Trademark Office*